(12) United States Patent
Kim et al.

(10) Patent No.: US 10,516,841 B2
(45) Date of Patent: Dec. 24, 2019

(54) PIXEL, PIXEL DRIVING CIRCUIT, AND VISION SENSOR INCLUDING THE SAME

(71) Applicant: Samsung Electronics Co., Ltd., Suwon-si, Gyeonggi-do (KR)

(72) Inventors: Jun Seok Kim, Hwaseong-si (KR); Hyun Surk Ryu, Hwaseong-si (KR); Bong Ki Son, Hwaseong-si (KR); Yun Jae Suh, Suwon-si (KR); Hee Jae Jung, Suwon-si (KR); Keun Joo Park, Seoul (KR); Seol Namgung, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/866,920

(22) Filed: Jan. 10, 2018

(65) Prior Publication Data

US 2018/0262703 A1    Sep. 13, 2018

(30) Foreign Application Priority Data

Mar. 8, 2017 (KR) .................. 10-2017-0029687
Jun. 26, 2017 (KR) .................. 10-2017-0080596

(51) Int. Cl.
*H04N 5/374* (2011.01)
*H04N 5/341* (2011.01)
(Continued)

(52) U.S. Cl.
CPC ..... *H04N 5/3741* (2013.01); *H01L 27/14603* (2013.01); *H01L 27/14609* (2013.01); (Continued)

(58) Field of Classification Search
CPC ...... H04N 5/3741; H04N 5/232; H04N 5/378; H04N 5/3415; H04N 5/374;
(Continued)

(56) References Cited

U.S. PATENT DOCUMENTS 6,253,161 B1    6/2001   Arias-Estrada
6,963,116 B2   11/2005   Kawahito
(Continued)

FOREIGN PATENT DOCUMENTS

| JP | 4243688 B2   | 3/2009 |
| JP | 2010-171666  | 8/2010 |
| JP | 2014-90394 A | 5/2014 |

OTHER PUBLICATIONS

Lichtsteiner et al."A 128x128 120 dB 15 μs Latency Asynchronous Temporal Contrast Vision Sensor", IEEE JSSC, Feb. 2008, 43(2), pp. 566-576.
(Continued)

*Primary Examiner* — Albert H Cutler
(74) *Attorney, Agent, or Firm* — Myers Bigel, P.A.

(57) ABSTRACT

A pixel includes a photoelectric device, a current readout unit configured to detect an electric current flowing in the photoelectric device to generate an input voltage, an event determination unit configured to determine an event occurrence and an event type responsive to the input voltage, and configured to output an event detection signal, and an event output unit configured to store the event detection signal for an event-storage period and configured to output the stored event detection signal responsive to an expiration of the event-storage period.

19 Claims, 9 Drawing Sheets

(51) Int. Cl.
*H01L 27/146* (2006.01)
*H04N 5/378* (2011.01)
*H04N 5/232* (2006.01)

(52) U.S. Cl.
CPC ............. *H04N 5/232* (2013.01); *H04N 5/341* (2013.01); *H04N 5/3415* (2013.01); *H04N 5/378* (2013.01); *H04N 5/3742* (2013.01)

(58) Field of Classification Search
CPC ......... H01L 27/14603; H01L 27/14609; H01L 27/14643
See application file for complete search history.

(56) References Cited

U.S. PATENT DOCUMENTS

| | | | |
|---|---|---|---|
| 7,804,426 | B2 | 9/2010 | Etcheson |
| 8,032,416 | B2 | 10/2011 | Concilio et al. |
| 9,455,295 | B2 | 9/2016 | Takeshita et al. |
| 9,554,100 | B2 | 1/2017 | Gousev et al. |
| 2007/0107038 | A1 | 5/2007 | Aronsson |
| 2008/0135731 | A1 | 6/2008 | Lichtsteiner et al. |
| 2010/0020186 | A1 | 1/2010 | Matsui |
| 2010/0110221 | A1 | 5/2010 | Morishita |
| 2010/0201869 | A1 | 8/2010 | Shin |
| 2013/0329952 | A1 | 12/2013 | Lee et al. |
| 2014/0009648 | A1 | 1/2014 | Kim et al. |
| 2014/0125994 | A1* | 5/2014 | Kim ................... G01B 11/22 356/601 |
| 2014/0326854 | A1* | 11/2014 | Delbruck ............... H04N 5/378 250/204 |
| 2014/0368712 | A1 | 12/2014 | Park et al. |
| 2015/0069218 | A1 | 3/2015 | Cho et al. |
| 2015/0319341 | A1 | 11/2015 | Sekine |
| 2015/0341585 | A1 | 11/2015 | Jin |
| 2015/0365617 | A1* | 12/2015 | Chen ................... H04N 5/3745 348/302 |
| 2016/0011654 | A1* | 1/2016 | Lee ..................... G06N 3/049 345/156 |
| 2016/0078001 | A1 | 3/2016 | Wang et al. |
| 2016/0078321 | A1 | 3/2016 | Wang et al. |
| 2016/0093273 | A1 | 3/2016 | Wang et al. |
| 2016/0094768 | A1 | 3/2016 | Ovsiannikov |
| 2016/0094787 | A1 | 3/2016 | Govil et al. |
| 2016/0203614 | A1 | 7/2016 | Wang et al. |
| 2016/0227135 | A1 | 8/2016 | Matolin et al. |
| 2016/0274643 | A1 | 9/2016 | Liu |
| 2017/0034466 | A1 | 2/2017 | Numata |
| 2017/0053407 | A1 | 2/2017 | Benosman et al. |
| 2017/0059399 | A1 | 3/2017 | Suh |
| 2017/0280079 | A1* | 9/2017 | Fu ....................... G06F 1/3234 |
| 2018/0167575 | A1* | 6/2018 | Watanabe ............ H04N 5/3745 |
| 2019/0052820 | A1* | 2/2019 | Berner ................ H04N 5/37452 |

OTHER PUBLICATIONS

Son et al. "A 640x480 Dynamic Vision Sensor with a 9μm Pixel and 300Meps Address-Event Representation", ISSCC, Feb. 2017, pp. 66-88.

* cited by examiner

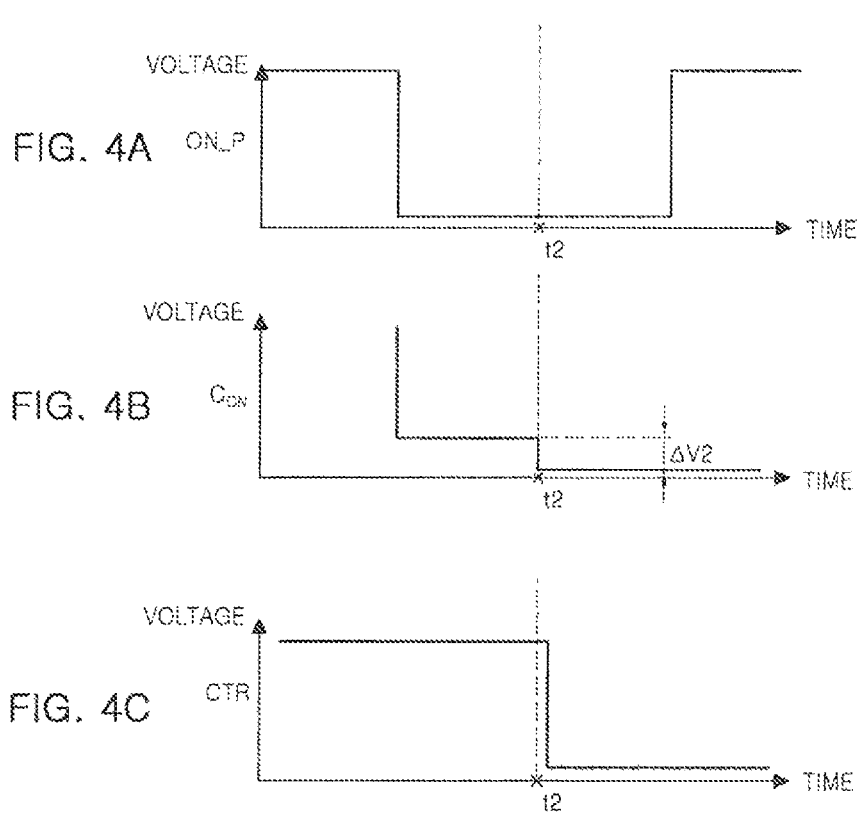

PIXEL, PIXEL DRIVING CIRCUIT, AND VISION SENSOR INCLUDING THE SAME

CROSS-REFERENCE TO RELATED APPLICATIONS

This application claims benefit of priority to Korean Patent Application Nos. 10-2017-0029687 and 10-2017-0080596 filed on Mar. 8, 2017 and Jun. 26, 2017 in the Korean Intellectual Property Office, the disclosures of which are incorporated herein by reference in their entireties.

BACKGROUND

1. Field

The present inventive concept relates to cameras and, more particularly, vision sensors including a pixel array and a driving circuit therefor.

2. Description of Related Art

Vision sensors are sensors operating in a scheme in which the sensors detect visual changes without frames, and may be applied to various fields, such as autonomous vehicles, artificial intelligence, and the like.

Vision sensors sense light, and when significant changes are detected, such vision sensors may convert the changes into electrical signals and may output the converted signals. The signals output by the vision sensors may include information regarding change detection time, coordinates of pixels in which a change has been detected, and the like. Typically, pixel events are processed individually or via predetermined pixel groups. As a result, while events for some pixels are being processed, events for other pixels may go away or new events in other pixels may arise. When event information is provided at approximately the same time, the event information may nevertheless be processed with different time stamps, which may introduce image artifacts. Analog circuitry used to process pixels may be complicated and difficult to design.

As the fields in which vision sensors may be applied are increasing, various studies are being undertaken to improve the performance of vision sensors.

SUMMARY

An aspect of the present inventive concept is to provide a pixel and a pixel driving circuit having improved performance, and a vision sensor including the same.

According to some embodiments of the present inventive concept, a pixel includes a photoelectric device; a current readout unit configured to detect an electric current flowing in the photoelectric device to generate an input voltage; an event determination unit configured to determine an event occurrence and an event type responsive to the input voltage, and configured to output an event detection signal; and an event output unit configured to store the event detection signal for an event-storage period and configured to output the stored event detection signal responsive to an expiration of the event-storage period.

According to some embodiments, of the present inventive concept, a pixel driving circuit includes a column driver configured to generate a signal to select any one among a plurality of column lines of a pixel array; a row driver configured to detect whether an event has occurred from respective pixels of the pixel array connected to the one of the plurality of column lines selected by the column driver; a controller configured to control operation timings of the column driver and the row driver; and an address generator configured to generate and output an address of one of the pixels in which the event has occurred and was detected by the row driver. The pixel driving circuit is implemented as a digital block.

According to some embodiments of the present inventive concept, a vision sensor includes a pixel array including a plurality of pixels arranged in matrix form, and a pixel driving circuit configured to detect whether an event has occurred in the plurality of respective pixels of the pixel array. Each of the plurality of pixels includes a photoelectric device; a current readout unit configured to detect an electric current flowing in the photoelectric device to generate an input voltage; an event determination unit configured to determine an event occurrence and an event type, using the input voltage, and configured to output an event detection signal; and an event output unit configured to store the event detection signal for an event-storage period and configured to output the stored event detection signal responsive to an expiration of the event-storage period.

It is noted that aspects of the inventive concepts described with respect to one embodiment, may be incorporated in a different embodiment although not specifically described relative thereto. That is, all embodiments and/or features of any embodiment can be combined in any way and/or combination. These and other aspects of the inventive concepts are described in detail in the specification set forth below.

BRIEF DESCRIPTION OF DRAWINGS

The above and other aspects, features and other advantages of the present inventive concept will be more clearly understood from the following detailed description taken in conjunction with the accompanying drawings, in which:

FIGS. 4A to 4C are diagrams illustrating data retention performance at the time of turning a switch off in the pixel illustrated in FIG. 2 when an on-event has not occurred;

DETAILED DESCRIPTION

Hereinafter, example embodiments of the present inventive concept will be described with reference to the accompanying drawings.

Some embodiments of the inventive concept arise from a realization that storage circuitry, such as a capacitor circuit, for example, may be used to store event occurrence information for a pixel. One or more switches may be used to coordinate the collection of event information for storage and then to prevent new event information from overwriting the collected event information. The event information contained in the storage circuitry may then be processed in concert or substantially simultaneously, which may reduce image distortion.

Figure 1:
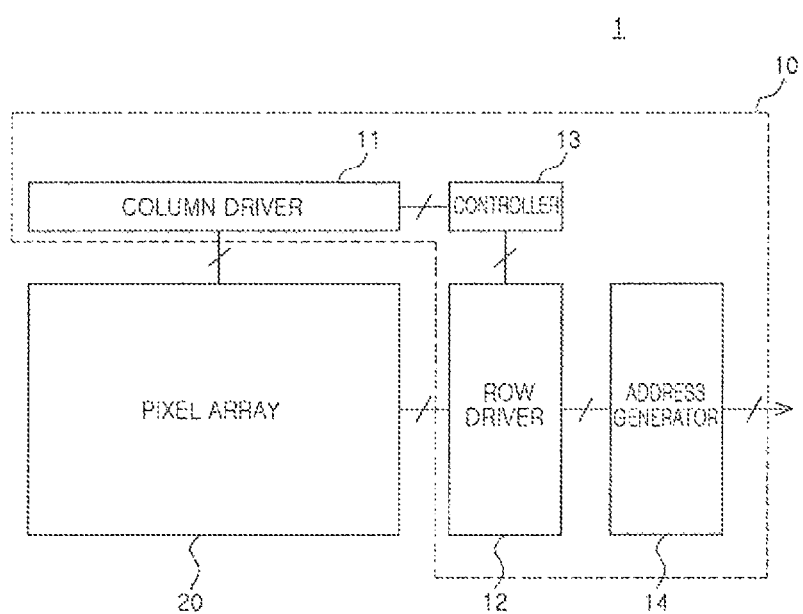
FIG. 1 is a block diagram of a vision, sensor according to an example embodiment, of the present inventive concept.

FIG. 1 is a block diagram of a vision sensor according to an example embodiment of the present inventive concept.

Referring to FIG. 1, a vision sensor 1 according to an example embodiment may include a pixel driving circuit 10 and a pixel array 20.

The pixel array 20 may include a plurality of pixels arranged in matrix form. Each pixel may include a photoelectric device and a pixel circuit. The pixel will be described in detail with reference to FIG. 2.

The pixel driving circuit 10 may be provided to detect whether an event has occurred in respective pixels constituting the pixel array 20, and may be configured to include a column driver 11, a row driver 12, a controller 13, and an address generator 14.

The column driver 11 may generate a signal selecting one of a plurality of column lines of the pixel array 20, and may apply the signal to the pixel array 20.

The row driver 12 may detect whether an event has occurred from respective pixels connected to a column line selected by the column driver 11. In addition, to detecting whether the event has occurred from pixels connected to a column line subsequently selected by the column driver 11, the row driver 12 may generate a signal resetting data of pixels connected to a column line currently selected by the column driver 11 to input the generated signal to the pixel array 20.

The controller 13 may control operation timings of the column driver 11 and the row driver 12. In addition, the controller 13 may generate other control signals irrespective of a column line and a row line.

The address generator 14 may generate and output an address of a pixel in which an event has occurred, based on whether the event has occurred, detected from pixels of the pixel array 20.

According to an example embodiment, the pixel driving circuit 10 may be implemented as a digital block. For example, a circuit detecting an event occurring in the pixel array 20 and a circuit controlling an event detecting operation may all be implemented as a digital block.

As such, for example, when the pixel driving circuit 10 is implemented as the digital block, operations of the pixel driving circuit 10 may be adjusted through adjustment of a register or the like, without limitations with respect to a readout time, a frame rate or the like, in a manner different from that of an analog circuit. For example, times at which the column driver 11 and the row driver 12 detect signals from the pixel array 20 and input signals to the pixel array 20, and the like, may be independently adjusted. Thus, functions of the vision, sensor 1 may be variously modified and implemented.

According to an example embodiment, the row driver 12 may be implemented as a shift register to select respective lines.

Figure 2:
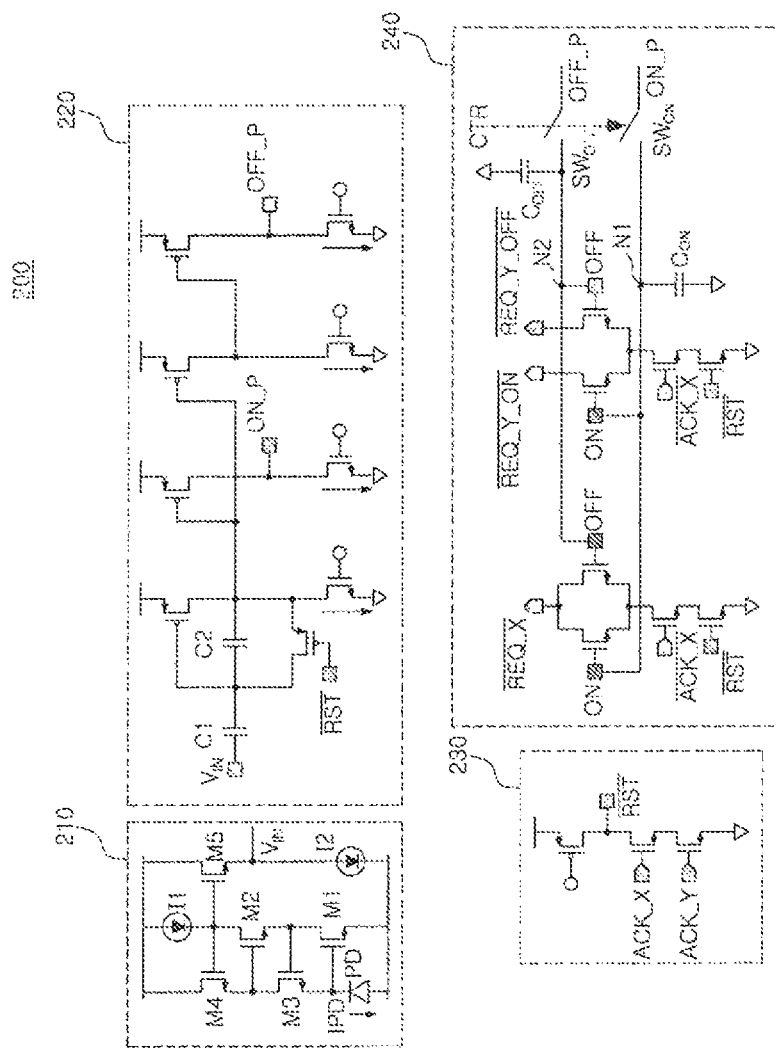
FIG. 2 is a diagram illustrating a pixel of a pixel array illustrated in FIG. 1.

FIG. 2 is a diagram illustrating a pixel of the pixel array illustrated in FIG. 1.

With reference to FIG. 2, a pixel 200 according to an example embodiment may be configured to include a current readout unit 210, an event determination unit 220, an event reset unit 230, and an event output unit 240. Further, the circuit diagram of respective components illustrated in FIG. 2 is merely provided by way of example, and, thus, may be variously modified and implemented in accordance with different embodiments of the inventive concept.

The current readout unit 210 may detect a current IPD flowing in a photoelectric device PD to generate an input voltage VIN. The input voltage VIN may be applied to the event determination unit 220 and may be used to determine whether an event has occurred and a type of the event.

In this case, the event may include a dynamic input, such as, for example, a change in light intensity of incident light. The dynamic input may be provided by movement of an object, a change in light projected on an object, a change in light emitted by an object, or the like.

The event determination unit 220 may determine whether an event has occurred and may determine an event type, using the input voltage VIN, and may output an event detection signal depending on the determination result.

In an example embodiment, for example, when the current IPD flowing through the photoelectric device PD increases to a predetermined value or more, the event determination unit 220 may determine that an event has occurred, such as, for example, an on-event has occurred. When the on-event has occurred, an on-event detection, signal ON_P of the event determination unit 220 may be activated.

In an example embodiment, when the current IPD flowing in the photoelectric device PD decreases to a specific value or less, the event determination unit 220 may determine that an off-event has occurred. When the off-event has occurred, an off-event detection signal OFF_P of the event determination unit 220 may be activated.

The on-event detection, signal ON_P and the off-event detection, signal OFF_P may be output through an on-event output terminal ON and an off-event output terminal OFF of the event output unit 240, respectively.

The event reset unit 230 may reset pixels to an initial state in response to a reset signal RST.

The event output unit 240 may store an event detection signal output by the event determination unit 220 for an event-storage period, and may output the stored event detection signal when the event-storage period has elapsed and the event-hold period arrives.

In an example embodiment, the event output unit 240 may include an off-capacitor $C_{OFF}$ connected between a node N2 connected to the off-event output terminal OFF and a ground, and an on-capacitor $C_{ON}$ connected between a node N1 connected to the on-event output terminal ON and a ground.

The off-event detection signal OFF_P and the ON-event detection signal ON_P may be input to the off-capacitor $C_{OFF}$ and the on-capacitor $C_{ON}$ through an off-switch $SW_{OFF}$ and an on-switch $SW_{ON}$, respectively. The off-capacitor $C_{OFF}$ and the on-capacitor $C_{ON}$ may operate as a sampling circuit that is configured to store the event detection signal therein.

In an example embodiment, while the off-switch $SW_{OFF}$ and the on-switch $SW_{ON}$ are turned on, i.e., are in a closed state, event occurrence data determined by the event determination unit 220 may be stored in the off-capacitor $C_{OFF}$ and the on-capacitor $C_{ON}$. For example, when the off-switch $SW_{OFF}$ and the on-switch $SW_{ON}$ are turned off, i.e., in an open state, in response to a switch control signal CTR, the event occurrence data at the moment of the turn-off may be stored in the off-capacitor $C_{OFF}$ and the on-capacitor $C_{ON}$. Thus, the event occurrence data may be stored in the capacitors at the same point in time by simultaneously turning off the off-switch $SW_{OFF}$ and the on-switch $SW_{ON}$, included in a plurality of pixels of the pixel array 20.

The event occurrence and the event types of respective pixels may be determined by voltages of the on-event output terminal ON and the off-event output terminal OFF of the event output unit 240. In an example embodiment, since the off-capacitor $C_{OFF}$ and the on-capacitor $C_{ON}$ are connected to the off-event output terminal OFF and the on-event output terminal ON, respectively, and the data stored in the respective capacitors $C_{ON}$ and $C_{OFF}$ may be maintained for a predetermined period of time even when the switches $SW_{OFF}$ and $SW_{ON}$ turned off, a global shutter operation in which all the pixels are scanned for a corresponding time may be implemented. Thus, the event occurrence data may be processed at the same point in time and, thus, image distortion may be significantly reduced.

Although the example embodiment illustrates the off-capacitor $C_{OFF}$ and the on-capacitor $C_{ON}$, as units storing the event detection signals, the capacitors may be replaced or supplemented with storage devices, such as an SRAM or the like.

Figure 3A:
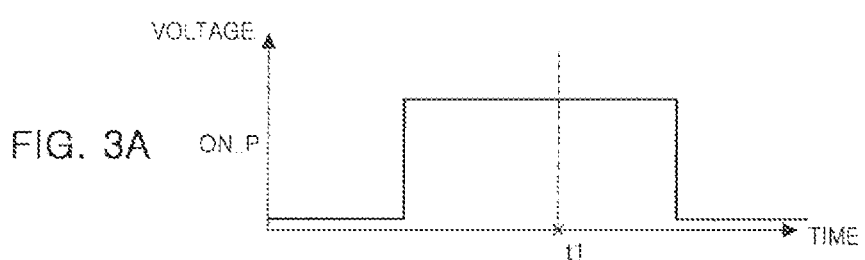
FIGS. 3A to 3C are diagrams illustrating data retention performance at the time of turning a switch off in the pixel illustrated in FIG. 2 when an on-event has occurred.

FIGS. 3A to 4C are diagrams illustrating data retention performance when a switch is turned off in the pixel illustrated in FIG. 2. FIGS. 3A to 3C illustrate a case in which an on-event has occurred, and FIGS. 4A to 4C illustrate a case in which an on-event has not occurred.

Figure 3B:
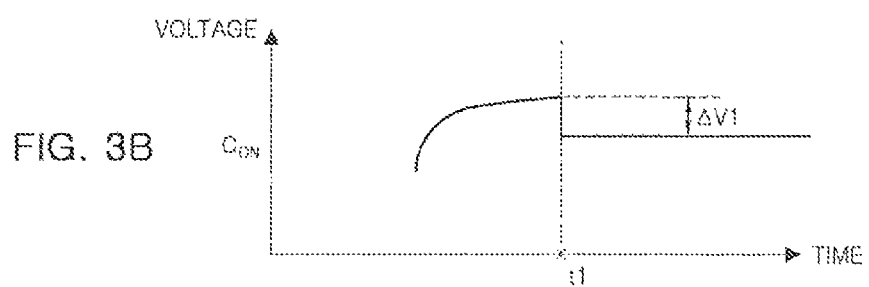
Figure 3C:
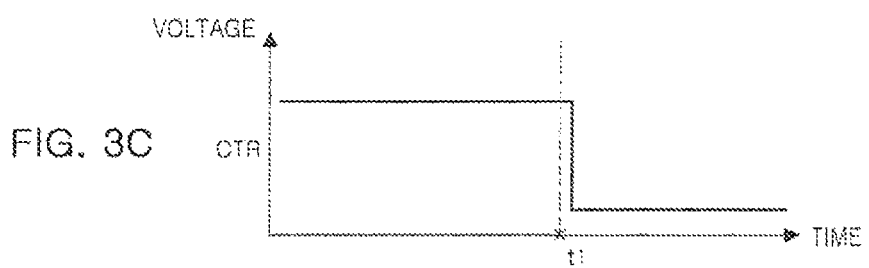

With reference to FIGS. 3A to 3C, as the on-event occurs before a time point t1 as illustrated in FIG. 3A, a logic value of the on-event detection signal ON_P output by the event determination unit 220 may be changed from a low logic value to a high logic value.

In addition, the off-switch $SW_{OFF}$ and the on-switch $SW_{ON}$ are turned on by the switch control signal CTR having a high logic value illustrated in FIG. 3C, and, thus, the on-capacitor $C_{ON}$ may be charged by the on-event detection signal ON_P as illustrated in FIG. 3B.

Because the off-event and the on-event may not occur at the same time, the turn-on state of the off-switch $SW_{OFF}$ may not affect the off-capacitor $C_{OFF}$.

After the time point t1, the switch control signal CTR may change to a low logic value as illustrated in FIG. 3C, and, thus, the off-switch $SW_{OFF}$ and the on-switch $SW_{ON}$ may be turned off.

As illustrated in FIG. 3B, the on-capacitor $C_{ON}$ may maintain the voltage charged before the time point t1, even after the on-switch $SW_{ON}$ is turned off, and, thus, the on-event output terminal ON connected to the on-capacitor $C_{ON}$ may also maintain a high voltage value. Because the on-event detection signal ON_P is not input after the time point t1, the voltage of the on-capacitor $C_{ON}$ may be reduced by a first electric potential $\Delta V1$. However, the first electric potential $\Delta V1$ may have a very low value, for example, a few tens of mV, and, thus, an on-event occurrence state may be detected by the voltage output by the event output unit 240 through the on-event output terminal ON even after the time point t1.

Next, referring to FIGS. 4A to 4C, in a case in which the on-event does not occur before a time point t2 as illustrated in FIG. 4A, a logic value of the on-event detection signal ON_P may change from a high logic value to a low logic value.

Further, the off-switch $SW_{OFF}$ and the on-switch $SW_{ON}$ are turned on by the switch control signal CTR having a high logic value shown in FIG. 4C, and, thus, the on-capacitor $C_{ON}$ may be discharged by the on-event detection signal ON_P as illustrated in FIG. 4B.

After the time point t2, the switch control signal CTR changes to a low logic value as illustrated in FIG. 4C, and, thus, the off-switch $SW_{OFF}$ and the on-switch $SW_{ON}$ may be turned off.

As illustrated in FIG. 4B, the on-capacitor $C_{on}$ may maintain the voltage discharged before the time point t2 even after the on-switch $SW_{ON}$ is turned off, and, thus, the on-event output terminal ON connected to the on-capacitor $C_{ON}$ may also maintain a low voltage value. Because the on-event detection signal ON_P is not input after the time point t2, the voltage of the on-capacitor $C_{ON}$ may be reduced by the second electric potential $\Delta V2$. Thus, a state in which no on-event has occurred after the time point t2 may be detected by the voltage output by the event output unit 240 through the on-event output terminal ON, FIG. 5 is a diagram illustrating another embodiment of the event output unit illustrated in FIG. 2 according to some embodiments of the inventive concept.

Figure 5:
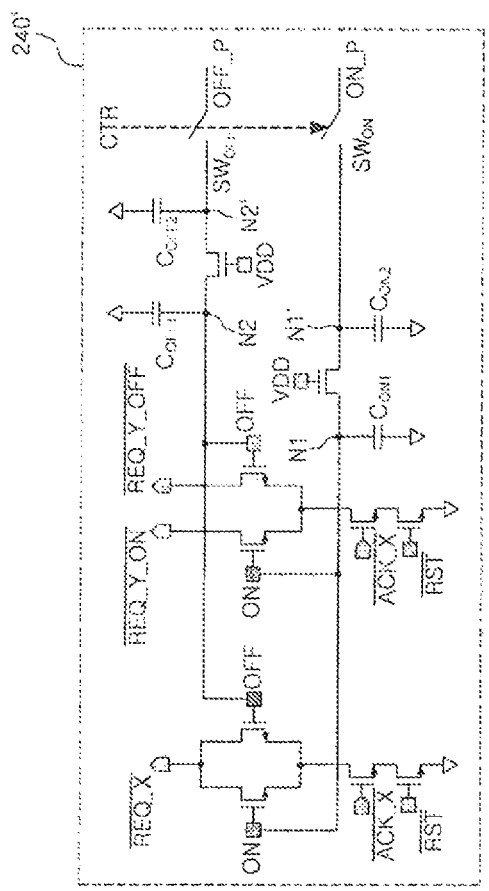
FIG. 5 is a diagram illustrating an event output unit according to some embodiments of the present inventive concept.

As illustrated in FIG. 5, an event output unit 240' may be implemented by capacitors $C_{OFF1}$, $C_{OFF2}$, $C_{ON1}$ and $C_{ON2}$ as circuits storing event detection signals, and a switching device having an input voltage VDD applied thereto.

In detail, the event output unit 240' may include a first off-capacitor $C_{OFF1}$ connected between a node N2 connected to an off-event output terminal OFF and a ground, a second off-capacitor $C_{OFF2}$ connected, between a node N2' connected to an off-switch $SW_{OFF}$ and a ground, and a switching device connected between the nodes N2 and N2'. In this case, the input voltage VDD may be applied to the switching device.

Similarly, the event output unit 240' may include a first on-capacitor $C_{ON1}$ connected between a node N1 connected to an on-event output terminal ON and a ground, a second on-capacitor $C_{ON2}$ connected between a node N1' connected to an on-switch $SW_{ON}$ and a ground, and a switching device connected between the nodes N1 and N1', and an input voltage VDD may be applied to the switching device.

For example, when the event output unit 240' is implemented as illustrated in FIG. 5, even when the off-switch $SW_{OFF}$ and the on-switch $SW_{ON}$ are turned off, loss of voltage in the first off-capacitor $C_{OFF1}$ or the first on-capacitor $C_{ON1}$ may be significantly reduced by the switching device.

Figure 6:
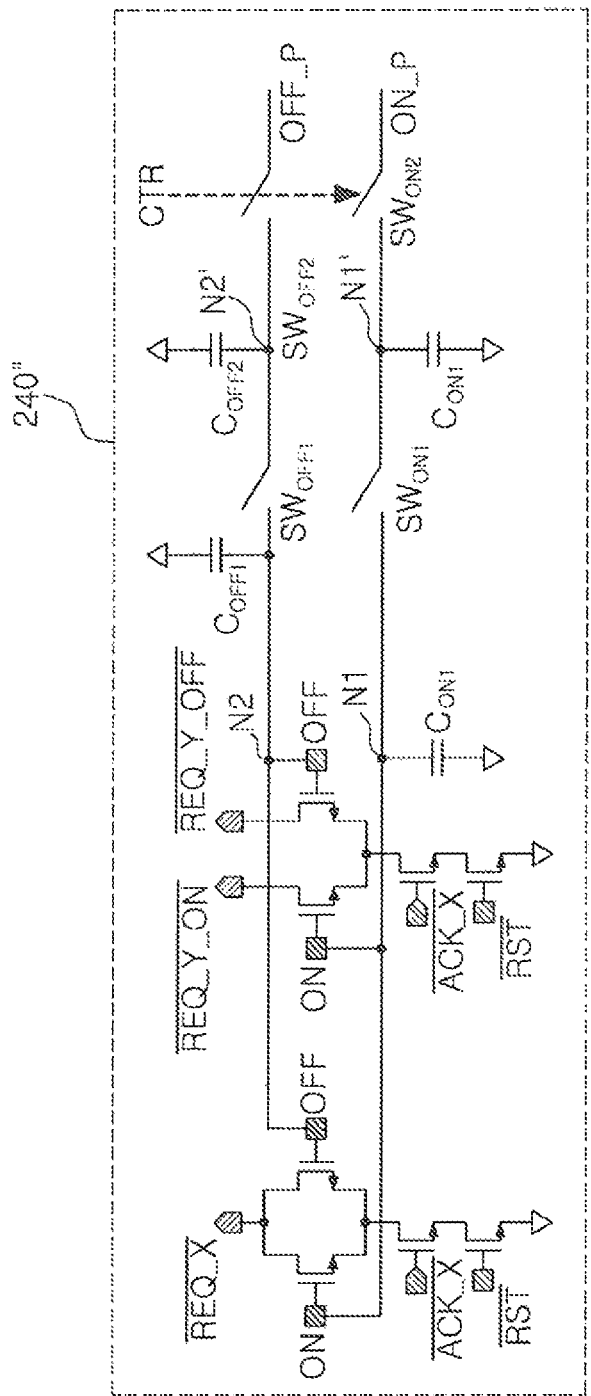
FIG. 6 is a diagram illustrating an event output unit according to further embodiments of the present inventive concept.

FIG. 6 is a diagram illustrating another embodiment of the event output unit illustrated in FIG. 2 according to some embodiments of the inventive concept.

As illustrated in FIG. 6, an event output unit 240" may be implemented by capacitors $C_{OFF1}$, $C_{OFF2}$, $C_{ON1}$ and $C_{ON2}$ as circuits storing event detection signals, and switches $SW_{OFF1}$, $SW_{OFF2}$, $SW_{ON1}$ and $SW_{ON2}$.

In detail, the event output unit 240" may include a first off-capacitor $C_{OFF1}$ connected between a node N2 connected to an off-event output terminal OFF and a ground, a second off-capacitor $C_{OFF2}$ connected between a node N2' connected to a second off-switch $SW_{OFF2}$ and a ground, and a first off-switch $SW_{OFF1}$ connected between the nodes N2 and N2'. In this case, the first and second off-switches $SW_{OFF1}$ and $SW_{OFF2}$ may be turned off simultaneously with each other in response to a control signal CTR.

Similarly, the event output unit 240" may include a first on-capacitor $C_{ON1}$ connected between a node N1 connected to an on-event output terminal ON and a ground, a second on-capacitor $C_{ON2}$ connected between a node N1' connected to a second on-switch $SW_{ON2}$ and a ground, and a first on-switch $SW_{ON1}$ connected between the nodes N1 and N1'. In this case, the first and second on-switches $SW_{ON1}$ and $SW_{ON2}$ may be turned off simultaneously with each other in response to the control signal CTR.

As illustrated in FIG. 6, by implementing the capacitor and the switch in two stages in the event output unit 240", voltage loss in the first off-capacitor $C_{OFF1}$ or the first on-capacitor $C_{ON1}$ may be significantly reduced.

FIGS. 7A, 7B, 8, and 9 are operation timing diagrams of a vision sensor according to an example embodiment. The operation timing diagrams illustrated in FIGS. 7A, 7B, 8, and 9 are provided as examples to describe operations of the pixel driving circuit 10 illustrated in FIG. 1, and, thus, the pixel driving circuit 10 may also operate at timings different from the timings of FIGS. 7A, 7B, 8, and 9 in other embodiments of the inventive concept.

Figure 7:
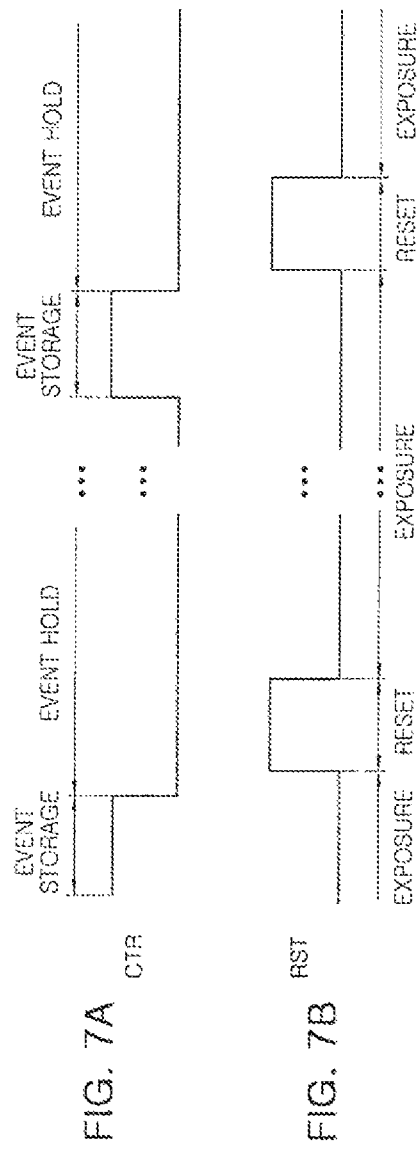
FIGS. 7A, 7B, 8, and 9 are operation timing diagrams of a vision sensor according to some embodiments of the present inventive concept.

With reference to FIGS. 7A and 7B, the switch control signal CTR controlling the off-switch $SW_{OFF}$ and the on-switch $SW_{ON}$ may have a high logic value in the event-storage period and a low logic value in the event-hold period.

Thus, the off-switch $SW_{OFF}$ and the on-switch $SW_{ON}$ may be turned on for the event-storage period in which an event state is stored, and, thus, data regarding an event occurrence state may be stored in the off-capacitor $C_{OFF}$ and the on-capacitor $C_{ON}$.

For example, when the event-storage period has elapsed and the event-hold period arrives, the off-switch $SW_{OFF}$ and the on-switch $SW_{ON}$ may be turned off in response to the switch control signal CTR. For the event-hold period, voltages of the on-event output terminal ON and the off-event output terminal OFF of the event output unit 240 may be determined as the voltages of the off-capacitor $C_{OFF}$ and the on-capacitor $C_{ON}$, respectively.

As illustrated in FIG. 7B, a reset signal RST may have a high logic value in a reset period. In the reset period in which the reset signal RST has a high logic value, all of pixels may be reset to an initial state, As illustrated in FIGS. 7A and 7B, while the on-event output terminal ON and the off-event output terminal OFF of the event output section 240 consistently output a voltage representing an event state by the off-capacitor $C_{OFF}$ and the on-capacitor $C_{ON}$ as the event-hold period arrives, the reset period may be initiated and, thus, resetting of the pixels may be performed.

According to the example embodiment, because a global shutter function of simultaneously scanning all of the pixels may be implemented, and simultaneously therewith, a sufficient readout time may be secured, accurate data regarding events with respect to an object having fast motion may be generated.

Figure 8:
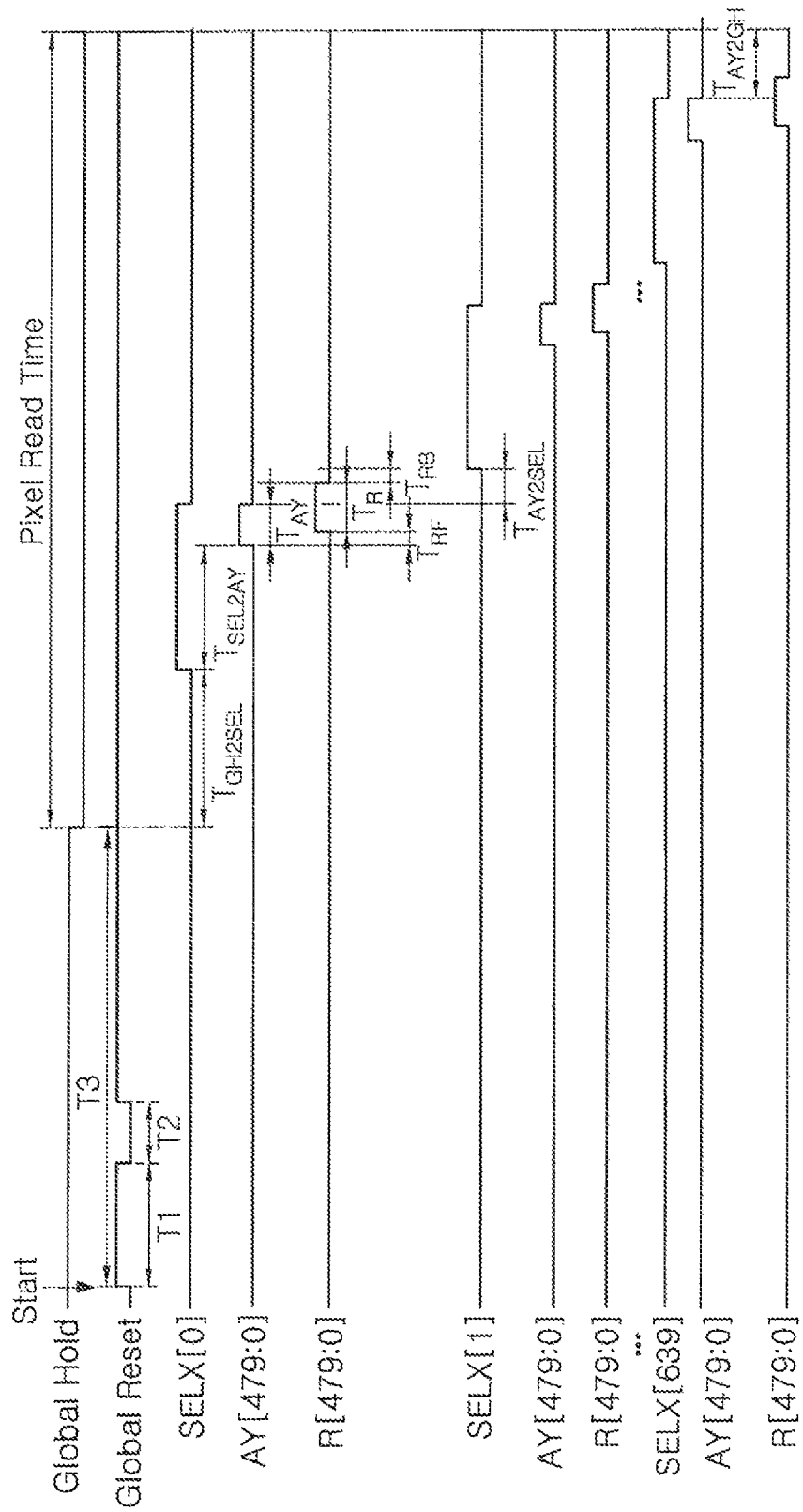

Referring to FIG. 8, the controller 13 may generate at least one of a global hold signal and a global reset signal. For example, a global reset operation may be performed for a period T3 before a pixel readout period (Pixel Read Time) in which a signal is read from pixels. The global reset operation may be performed for a period T2 belonging to the period T3.

In this case, the global hold indicates that when the event output unit includes a capacitor storing an event detection signal therein and a switch connected to the capacitor as in the pixel illustrated in FIG. 2, an event detection signal at the time of turn-off is stored in the capacitor by turning the switch off, and the global reset indicates that data of all pixels of the pixel array are reset.

Figure 9:
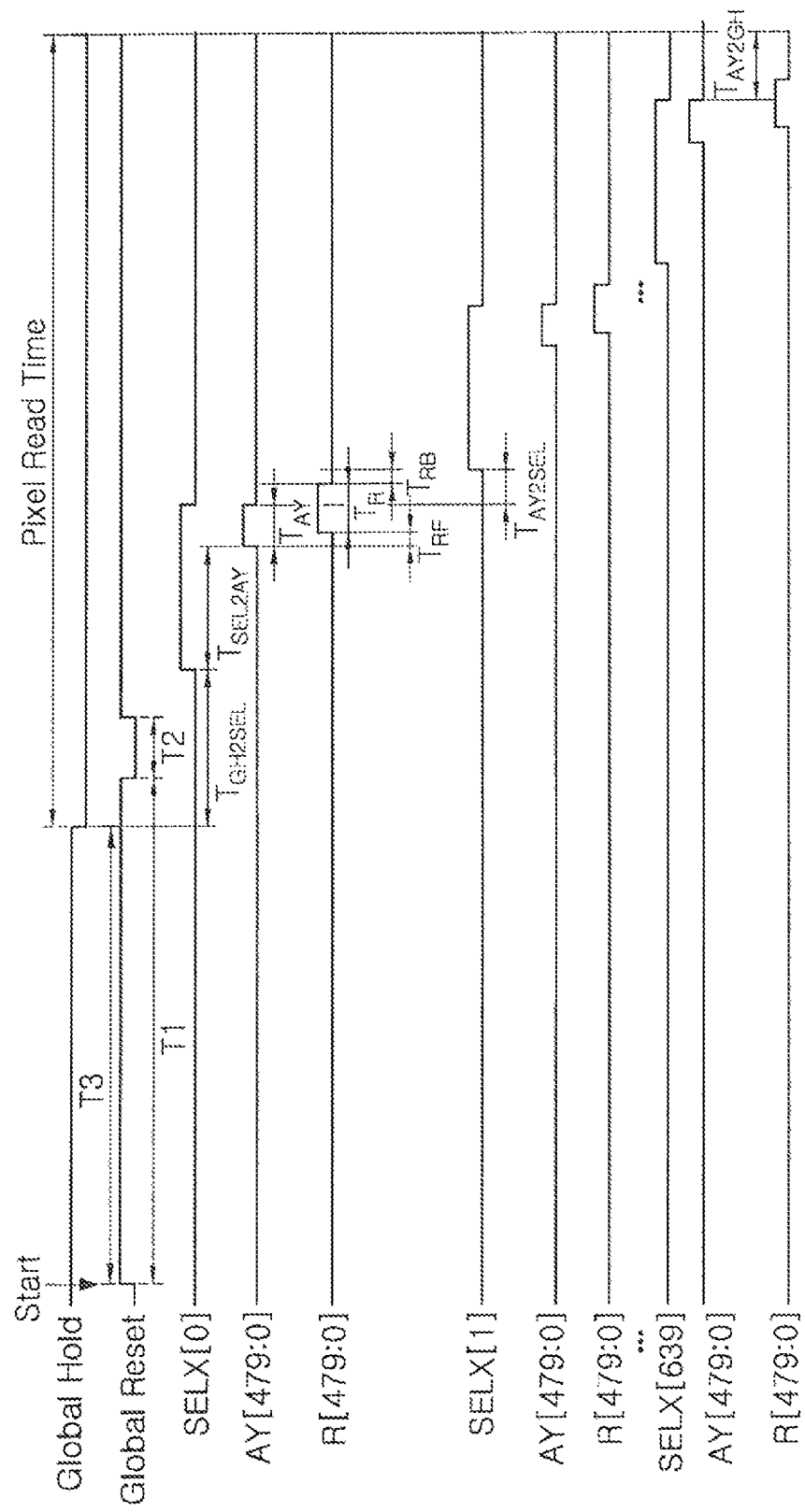

In a manner different from the operation timing illustrated in FIG. 8, the global reset operation may be performed for a period T2 after a period (Pixel Read Time) in which a signal is read out from pixels has arrived as illustrated in FIG. 9.

In some cases, the global hold and global reset operations may not be performed, and, in this case, the controller 13 may deactivate the global hold signal and the global reset signal.

For example, when the pixel readout operation is started, the column driver 11 may select any column line from the pixel array 20 in response to an SELX signal, and the row driver 12 may detect whether an event has occurred from respective pixels connected to the column line selected by the column driver 11.

In an example embodiment, the pixel array 20 may have a resolution of 640×480. In this case, the column driver 11 may select column lines 0 through 639 in a one-by-one manner, and the row driver 12 may detect whether an event has occurred from respective 480 pixels connected to the selected column line. The resolution of the pixel array 20 may be variously modified according to example embodiments of the inventive concept, The column driver 11 may sequentially select a column line from a 0th column line in a one-by-one manner, as illustrated in FIG. 8, but a scan order of the column driver 11 is not necessarily limited thereto. For example, the column lines may be selected in a one-by-one manner in a random order, or the column lines may be selected in a one-by-one manner according to predetermined rules in accordance with various embodiments of the inventive concept.

In the example embodiment illustrated in FIG. 8, the column driver 11 may select the 0th column line for a period $T_{SEL2BY}$, and the row driver 12 may receive an event detection signal indicating whether the event has occurred from pixels connected to the 0th column line.

The row driver 12 may transmit the event detection signal to the address generator 14, and the address generator 14 may convert an address and a type of a pixel in which the event occurred, and the like, into data of a predetermined format using the event detection signal, and may output the data to a digital circuit provided therebehind.

In further embodiments, the row driver 12 may output an AY signal resetting data of pixels connected to the 0th column line in a period $T_{AY}$. In an example embodiment, the row driver 12 may also output the AY signal only for pixels in which the event has occurred. For example, in the case of a pixel in which the event does not occur, the reset therefor may not be required. Alternatively, when the next frame period comes and the 0th column line is re-scanned, a pixel in which the event is to be detected may be prevented from being reset in advance by the AY signal.

In addition, the row driver 12 may output an R signal in a period $T_R$ before the next column line, for example, a 1st column line, may be selected by the column driver 11 to enable the pixel to be in an initial state, In an example embodiment, the row driver 12 may only output the R signal to pixels in which it is determined that an event has not occurred. Thus, a pixel in which the event has not occurred may be in an initial state, such as a pull-up state, a pull-down state, or the like.

As set forth above, according to an example embodiment, a scheme, in which the performance of a vision sensor may be improved and errors may be prevented from occurring in the vision sensor, may be provided.

While example embodiments have been shown and described above, it will be apparent to those skilled in the art that modifications and variations could be made without departing from the scope of the present inventive concept as defined by the appended claims.

What is claimed is:

1. A pixel comprising:
   a photoelectric device;
   a current readout unit configured to detect an electric current flowing in the photoelectric device to generate an input voltage;
   an event determination unit configured to determine an event occurrence and an event type responsive to the input voltage, and configured to output an event detection signal; and
   an event output unit configured to store the event detection signal for an event-storage period, and configured to output the event detection signal stored in the event output unit.

2. The pixel of claim 1, wherein the event output unit comprises:
   a storage unit connected to an event output terminal and configured to store the event detection signal; and
   a switch unit connected between the storage unit and an input terminal for the event detection signal.

3. The pixel of claim 2, wherein the event output unit is configured to store the event detection signal in the storage unit responsive to the switch unit being in a closed state, and is configured to output the event detection signal that is stored in the storage unit through the event output terminal responsive to the switch unit being in an open state.

4. The pixel of claim 2, wherein the storage unit comprises:
   an on-capacitor connected between a first node connected to an on-event output terminal and a ground; and
   an off-capacitor connected between a second node connected to an off-event output terminal and a ground.

5. The pixel of claim 4, wherein the switch unit comprises:
   an on-switch connected between the on-capacitor and an input terminal for an on-event detection signal; and
   an off-switch connected between the off-capacitor and an input terminal for an off-event detection signal.

6. The pixel of claim 2, wherein the storage unit comprises:
   a first on-capacitor connected between a first node connected to an on-event output terminal and a ground;
   a second on-capacitor connected between a third node connected to an on-switch and a ground;
   a first switching device connected between the first node and the third node;
   a first off-capacitor connected between a second node connected to an off-event output terminal and a ground;
   a second off-capacitor connected between a fourth node connected to an off-switch and a ground; and
   a second switching device connected between the second node and the fourth node.

7. The pixel of claim 2, wherein the storage unit comprises:
   a first on-capacitor connected between a first node connected to an on-event output terminal and a ground;
   a second on-capacitor connected between a third node connected to a second on-switch and a ground;
   a first on-switch connected between the first node and the third node;
   a first off-capacitor connected between a second node connected to an off-event output terminal and a ground;
   a second off-capacitor connected between a fourth node connected to a second off-switch and a ground; and
   a first off-switch connected between the second node and the fourth node.

8. The pixel of claim 1, wherein the event determination unit is configured to activate an on-event detection signal responsive to the electric current flowing in the photoelectric device increases to and/or exceeds a predetermined value.

9. The pixel of claim 1, wherein the event determination unit is configured to activate an off-event detection signal responsive to the electric current flowing in the photoelectric device decreases to and/or falls below a predetermined value.

10. The pixel of claim 1, further comprising an event reset unit configured to reset the pixel to an initial state in response to an input reset signal.

11. A pixel driving circuit comprising:
    a column driver configured to generate a signal to select any one among a plurality of column lines of a pixel array;
    a row driver configured to detect whether an event has occurred from respective pixels of the pixel array connected to the one of the plurality of column lines selected by the column driver;
    a controller configured to control operation timings of the column driver and the row driver; and
    an address generator configured to generate and output an address of one of the pixels in which the event has occurred and was detected by the row driver,
    wherein the pixel driving circuit is implemented as a digital block, and
    wherein the controller is configured to generate at least one of a global hold signal opening a plurality of switches in concert included in each of a plurality of pixels of the pixel array to store an event detection signal by each of the plurality of pixels, and a global reset signal resetting data of the plurality of pixels of the pixel array.

12. The pixel driving circuit of claim 11, wherein the row driver is configured to generate a reset signal resetting data of the pixels of the pixel array connected to the one of the plurality of column lines currently selected by the column driver.

13. The pixel driving circuit of claim 12, wherein the row driver is further configured to provide the reset signal to pixels of the pixel array connected to the one of the plurality of column lines currently selected by the column driver in which an event has occurred.

14. The pixel driving circuit of claim 11, wherein the row driver is configured to generate a signal pulling up or pulling down a pixel of the pixel array connected to one of the plurality of column lines currently selected by the column driver before the column driver selects a next column line.

15. The pixel driving circuit of claim 14, wherein the row driver is further configured to provide the signal to pixels of the pixel array connected to the one of the plurality of column lines currently selected by the column driver in which an event has not occurred.

16. The pixel driving circuit of claim 11, wherein the row driver comprises a shift register configured to select a respective one of the plurality of column lines.

17. The pixel driving circuit of claim 11, wherein the controller is further configured to enable the global hold signal and the global reset signal to be in an inactive state.

18. A vision sensor comprising:
    a pixel array including a plurality of pixels arranged in matrix form; and
    a pixel driving circuit configured to detect whether an event has occurred in the plurality of respective pixels of the pixel array, wherein each of the plurality of pixels includes:
a photoelectric device;
a current readout unit configured to detect an electric current flowing in the photoelectric device to generate an input voltage;
an event determination unit configured to determine an event occurrence and an event type, using the input voltage, and configured to output an event detection signal; and
an event output unit configured to store the event detection signal for an event-storage period, and configured to output the event detection signal stored in the event output unit.

19. The vision sensor of claim 18, wherein the event output unit comprises:
a storage unit connected to an event output terminal and configured to store the event detection signal; and
a switch unit connected between the storage unit and an input terminal for the event detection signal.

* * * * *